(12) United States Patent
Gochenaur

(10) Patent No.: US 8,710,791 B2
(45) Date of Patent: *Apr. 29, 2014

(54) SOLAR POWERED CHARGING SHELTER AND SYSTEM AND METHOD THEREOF

(75) Inventor: David J. Gochenaur, Rocky Ridge, MD (US)

(73) Assignee: Merit Builders, Inc., Rocky Ridge, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/404,685

(22) Filed: Feb. 24, 2012

(65) Prior Publication Data

US 2012/0146573 A1  Jun. 14, 2012

Related U.S. Application Data

(63) Continuation of application No. 12/787,032, filed on May 25, 2010, now Pat. No. 8,143,841.

(51) Int. Cl.
*H02J 7/00* (2006.01)

(52) U.S. Cl.
USPC .......................................................... 320/101

(58) Field of Classification Search
USPC .......................................................... 320/101
See application file for complete search history.

(56) References Cited

U.S. PATENT DOCUMENTS

| | | | |
|---|---|---|---|
| 4,098,263 A | 7/1978 | Lanciault | |
| 4,350,850 A | 9/1982 | Kovacik et al. | |
| 4,718,404 A | 1/1988 | Sadler | |
| 4,804,140 A | 2/1989 | Cantrell | |
| 4,828,225 A | 5/1989 | Owen et al. | |
| 4,853,500 A | 8/1989 | Tydlacka | |
| 4,904,205 A | 2/1990 | Rice | |
| 4,984,399 A | 1/1991 | Taylor | |
| 5,185,972 A * | 2/1993 | Markiewicz | 52/63 |
| 5,226,264 A * | 7/1993 | Walters | 52/63 |
| 5,349,975 A | 9/1994 | Valdner | |
| 5,357,052 A | 10/1994 | Hakeem | |
| 5,445,252 A | 8/1995 | McKee et al. | |
| 5,509,236 A * | 4/1996 | Angles | 52/74 |
| 5,855,262 A | 1/1999 | Jackson | |
| 5,913,487 A | 6/1999 | Leatherman | |
| 6,024,264 A | 2/2000 | Java | |
| 6,075,200 A | 6/2000 | O'Neill | |
| 6,170,839 B1 | 1/2001 | Kizewski | |
| 6,173,725 B1 | 1/2001 | Garth | |
| 6,648,750 B1 | 11/2003 | Wiseman | |
| 6,870,089 B1 | 3/2005 | Gray | |
| 7,047,902 B1 | 5/2006 | Little | |
| 7,168,538 B2 | 1/2007 | Pena | |
| 7,172,150 B1 | 2/2007 | Hutchison, II et al. | |
| 7,325,543 B2 | 2/2008 | Momii et al. | |
| 7,422,348 B1 | 9/2008 | Yates, II | |
| 7,531,741 B1 | 5/2009 | Melton et al. | |
| 557,292 A1 | 7/2009 | Shingleton et al. | |
| 2004/0065025 A1 | 4/2004 | Durham | |
| 2005/0109384 A1 | 5/2005 | Shingleton et al. | |
| 2006/0207192 A1 | 9/2006 | Durham | |
| 2007/0145952 A1 | 6/2007 | Arcena | |
| 2008/0303527 A1 | 12/2008 | Fechalos et al. | |
| 2009/0050194 A1 | 2/2009 | Noble et al. | |
| 2009/0223142 A1 | 9/2009 | Shingleton et al. | |
| 2010/0000165 A1 | 1/2010 | Koller | |
| 2010/0039062 A1 | 2/2010 | Gu et al. | |
| 2010/0275975 A1 | 11/2010 | Monschke et al. | |
| 2011/0074351 A1 | 3/2011 | Bianco et al. | |
| 2011/0140656 A1 | 6/2011 | Starr et al. | |
| 2012/0048983 A1 | 3/2012 | Bianco et al. | |

FOREIGN PATENT DOCUMENTS

| | | |
|---|---|---|
| CN | 201318040 Y | 9/2009 |
| DE | 100 10 330 A1 | 9/2001 |
| DE | 10 2005 049 222 A1 | 4/2007 |
| DE | 10 2007 063 450 A1 | 7/2009 |
| EP | 1 696 087 A1 | 8/2006 |
| JP | 3-40365 U | 4/1991 |
| JP | 8-19193 A | 1/1996 |
| JP | 11-303439 A | 11/1999 |
| JP | 11-303440 A | 11/1999 |
| JP | 2002-30774 A | 1/2002 |
| JP | 2002-33502 A | 1/2002 |
| JP | 2002-194912 A | 7/2002 |
| JP | 2007-224673 A | 9/2007 |
| WO | WO 2011/037636 A1 | 3/2011 |

OTHER PUBLICATIONS

Barry, Keith, *Solar Carport Gives Plug-Ins a Charge*, Autopia, Mar. 30, 2009.
CarportStructures Corporation, Solar Carports, http://www.carports-structures.com/solarcarports.php (last visited May 26, 2010).
Florian Solar, Florian Solar Products, http://www.floriansolarproducts.com/index.html (last visited May 26, 2010).
Product Sheet Park@Sol, Schletter, Inc., Updated Mar. 2010, available at http://www.schletter.us/featured-product.html (last accessed Apr. 22, 2011).
King, Danny "SAE sets standards for DC Combo fast charging", Posted Oct. 17, 2012, 2 pages, http://green.autoblog.com/2012/10/17/sae-sets-standards-for-dc-combo-fast-charging/.
SAE International "SAE Electric Vehicle and Plug in Hybrid Electric Vehicle Conductive Charge Coupler", Published Oct. 15, 2012, 2 pages, http://standards.sae.org/j1772_201210/.
SAE International "SAE Electric Vehicle and Plug in Hybrid Electric Vehicle Conductive Charge Coupler", Published Jan. 15, 2010, 2 pages, http://standards.sae.org/j1772_201001/.

* cited by examiner

*Primary Examiner* — Arun Williams
(74) *Attorney, Agent, or Firm* — Oblon, Spivak, McClelland, Maier & Neustadt, L.L.P.

(57) ABSTRACT

A solar powered charging shelter and system and method thereof. The shelter includes a metal standing seam roof and a flush mounted metal frame. The top of the roof has a plurality of solar units that provide power to at least a plurality of retractable electrical outlets or receptacles coupled to either the bottom of the roof or the metal frame. The retractable electrical outlets or receptacles are to provide power to or charge various electrical systems.

21 Claims, 6 Drawing Sheets

US 8,710,791 B2

SOLAR POWERED CHARGING SHELTER AND SYSTEM AND METHOD THEREOF

CROSS-REFERENCE TO RELATED APPLICATION

This application is a continuation of application Ser. No. 12/787,032 filed May 25, 2010 now U.S. Pat. No. 8,143,841.

FIELD OF THE INVENTION

The present invention relates to a solar powered charging shelter and system and method thereof. In particular, the present invention relates to a shelter with a metal roof in the form of a standing seam roof and a metal frame flush mounted to the roof, wherein the top of the roof has a plurality of solar panels for providing power to retractable electrical outlets or receptacles coupled to the metal frame or the bottom of the roof. The retractable electrical outlets can be used to provide power to or charge various electrical systems.

SUMMARY

Various disclosed embodiments (i.e., one, some, or all) of the present invention relate to a solar powered charging shelter. The solar powered charging shelter can comprise: a metal standing seam roof having a length and a width in plan view, the length being greater than the width; a metal frame; a foundation, wherein first ends of each said vertically oriented support beam are mechanically coupled to respective portions of said foundation; a plurality of solar panels mechanically coupled to the top of said roof, each said solar panel being mechanically coupled to said roof by a coupling element; a plurality of retractable electrical outlets mechanically coupled to bottom portions of a group of said horizontally oriented metal support beams; and a power interface unit electrically coupled to said plurality of solar panels and said electrical outlets. The metal frame can include a plurality of vertically oriented tubular metal support beams, wherein a first set of said vertically oriented support beams is of a first height and a second set of said vertically oriented support beams being of a second height, and the first height is different from the second height; and a plurality of horizontally oriented metal support beams running in a length-wise direction of said roof. Each said horizontally oriented metal support beam is comprised of two 'C-shaped' purlins arranged in touching, face-to-face fashion such that substantially no gap exists between touch points thereof, and top portions of each said horizontally oriented metal support beam are flush mounted so as to be in direct contact with the bottom of said roof and such that substantially no gap exists between the top portions and the bottom of said roof. All of the horizontally oriented metal support beams of the group can be arranged along the same or substantially the same longitudinal axis, wherein the longitudinal axis is in the same direction as the length-wise direction of the said roof, and the electrical outlets can be mechanically coupled in spaced apart relation to one another. The power interface unit is electrically coupled to said plurality of solar panels and said electrical outlets, said power interface unit being configured to receive power from said solar panels and to provide power to each of said electrical outlets. The roof is at a non-horizontal angle based on the respective first and second heights of the first and second sets of said vertically oriented metal support beams.

Various embodiments also include a charging system for a shelter having a metal standing seam roof and a metal frame flush mounted to the roof. The charging system can comprise: an array of photovoltaic devices mounted on a top side of said roof; a plurality of retractable electrical outlets mounted to said frame, a first set of said plurality of retractable electrical outlets for supplying a voltage having a first value and a second set of said plurality of retractable electrical outlets for supplying a voltage having a second value, the first voltage value being less than the second voltage value; a power interface element electrically connected to said array to receive power from said array, said power interface element being configured to output the voltages at the first and second values; and at least one controller electrically connected to said power interface element and said plurality of retractable electrical outlets, the controller selectively outputting one of the voltage having the first value and the voltage having the second value based on a user input.

Various embodiments also include a method of making a charging canopy. The method can comprise: providing a steel standing seam roof comprised of a plurality of pieces fixedly coupled together; providing a steel frame; providing a plurality of photovoltaic devices coupled to the top of said roof; providing a plurality of retractable electrical outlets, said electrical outlets being in spaced apart relation to one another, and being configured to output an electrical characteristic to a load coupled thereto; and providing an interface unit electrically coupled to said plurality of photovoltaic devices and said electrical outlets, said power interface unit being configured to receive power from said photovoltaic devices and to provide power to each of said electrical outlets. The steel frame can include a plurality of vertically oriented support members, a first set of said vertically oriented support members being of a first height and a second set of said vertically oriented support members being of a second height, and a plurality of horizontally oriented support members running in a length-wise direction of said roof. Top portions of each said horizontally oriented support members are flush mounted so as to be in direct contact with the bottom of said roof.

BRIEF DESCRIPTION OF THE DRAWINGS

The accompanying drawings illustrate embodiments of the disclosed subject matter. The disclosed subject matter will be best understood by reading the ensuing specification in conjunction with the drawing figures, in which like elements are designated by like reference numerals, and wherein.

DETAILED DESCRIPTION

Figure 1:
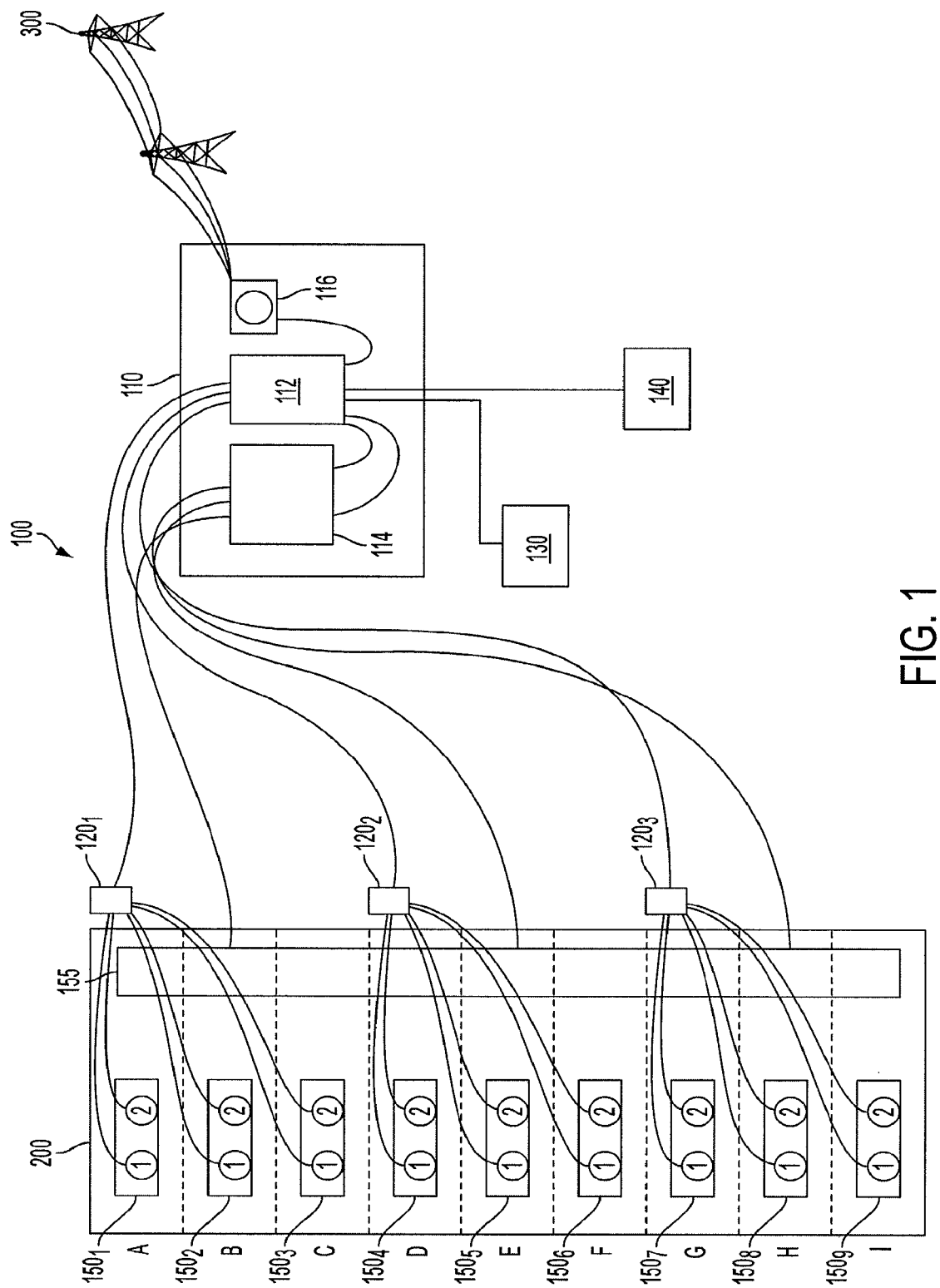
FIG. 1 is a diagrammatic representation of a system according to various embodiments of the disclosed subject matter.

Generally speaking, various embodiments of the present invention are directed to a solar powered charging shelter, such as a canopy. The shelter can be a metal frame shelter with a metal roof having photovoltaic elements, such as solar panels, arranged thereon or coupled thereto. In various embodiments the metal is steel, but is not so limited to being steel, and can be any suitable metal or metallic-like material. In various embodiments, the metal frame roof can be a standing seam roof, and some tubular or generally tube-shaped elongate support members of the metal frame can be flush mounted to an underside of the roof such that the roof is in direct contact with portions these members, with no or substantially no gaps or spacing between the portions of the members and the roof. Note that in various embodiments, a very thin, flat strap brace may be between portions of the roof and the flush mounted tubular or generally tube-shaped elongate support members. Such flush mounting of tubular or generally tube-shaped elongate support members can be advantageous because there is no gap or space for unwanted materials or objects to enter and occupy. Furthermore, there is no ledge upon which unwanted materials or objects can accumulate or occupy, such as would be the case if 'Z' or 'I' purlins, for example, were used. Such unwanted materials or objects can include, for example, a bird or another animal or insect, its "nest," its offspring, its food, or some other material or object.

In various embodiments, each flush mounted elongate support member can be comprised of two 'C-shaped' purlins arranged in touching, face-to-face manner such that no or substantially no gap exists between touch points. This arrangement can be viewed as generally tube-shaped. Alternatively, the elongate support members can be square-shaped, hollow purlins. In various embodiments, the frame can use a combination of face-to-face arranged 'C-shaped' purlins and square-shaped hollow purlins. These elongate support members may have caps or some other form of end piece (including other frame portions) that prevent access at the ends of the members.

Hanging from either a group of the flush mounted elongate support members of the metal frame mentioned above or from the roof itself are electrical outlets or receptacles. The electrical outlets can be used to provide power (including voltage and/or current) to an electrical load, such for charging a battery in a vehicle. One reason for mounting the electrical outlets overhead as described above is so the electrical outlets may be kept out of the way of vehicles going to and from under the shelter, thereby ensuring that the electrical outlets do not get damaged by the vehicles and vice versa. Another reason is to keep the electrical outlets away from the elements and ground contaminants as much as possible. In various embodiments, the roof can act as a barrier to weather-related elements, such as rain or snow. In various embodiments, the electrical outlets can be retractable reels that can extend and retract a power cord and plug thereof.

Each electrical outlet may handle multiple output values, such as a first voltage (e.g., a level 1 voltage) in the range of at or about 110 through at or about 120 VDC, for instance, a second voltage (e.g., a level 2 voltage) in the range of at or about 220 through at or about 240 VDC, for instance, and a third voltage (e.g., a level 3 voltage) at or about 480 VDC, for instance. Alternatively, in various embodiments, there may be an electrical outlet for each output value. In such a case where multiple output values are available, which of the available output values to output may be selected by a user or a service provider at a control station, for example.

Turning now to the figures, FIG. 1 is a diagrammatic representation of a system 100 according to various embodiments of the disclosed subject matter.

System 100 can comprise a shelter 200 and an interface 110 electrically connected to shelter 200. Optionally, interface 110 can also be mechanically coupled to shelter 200. In various embodiments, system 100 optionally can have a plurality of controllers 120 and/or a charge holding element 130, such as a battery or a capacitive element. Furthermore, in various embodiments, system 100 can be electrically coupled to a load 140, such as another electrical system, for providing an electrical characteristic thereto, for instance power, voltage, current, and/or charge. For example, the electrical system can be a lighting system, a commercial electrical system, or some other non-residential electrical system. In various embodiments, system 100, and in particular, interface 110, can be coupled to a utility grid 300. In such a case, system 100 can provide power to utility grid 300 and receive power from the utility grid 300. The amount of power provided to and received from the utility grid can be monitored, recorded, and/or output to various interested parties.

Shelter 200 can have a plurality of electrical outlets 150 and a photovoltaic element 155 mechanically connected to shelter 200. Electrical outlets 150 and photovoltaic element 155 can also be electrically connected to interface 110. In various embodiments, electrical outlets 150 can be electrically connected to interface 110 via an associated controller 120 (FIG. 1, for example, shows three controllers 120).

Generally speaking, a photovoltaic element is an array of cells containing solar photovoltaic material that converts solar radiation into direct current electricity. Photovoltaic element 155 can be of any suitable configuration and type. For example, in various embodiments, photovoltaic element 155 may include a grid or an array of solar panels mechanically coupled to a top side of shelter 200. Alternatively, photovoltaic element 155 may be comprised of films adhered directly to the top side of shelter 200. In another alternative embodiment, photovoltaic element 155 can be comprised of an arrangement of solar panels and films. As will be discussed more later, photovoltaic element 155 may be moveable or repositionable to be optimally oriented to capture a maximum amount of solar radiation possible and therefore output a maximum amount of direct current electricity as possible. In various embodiments, photovoltaic element or portions thereof may be rotatable.

Photovoltaic element 155 can be comprised of any suitable number of solar panels and/or films to produce a minimum output power. In various embodiments, photovoltaic element 155 can have a minimum output capacity of at or about 6.8 kW, a minimum output capacity of at or about 16 kW, or a minimum output capacity of at or about 20 kW. For example, in various embodiments, photovoltaic element 155 can output 16 kW or greater at one time. That is to say, in various embodiments, photovoltaic element 155 can have a minimum output capacity at one time of at or about 16 kW, and such output capacity may be used to charge simultaneously nine vehicles parked under shelter 200 in parking spots A through I, for example. In various embodiments, photovoltaic element 155 can output a range of power. In various embodiments, photovoltaic element 155 can provide output in the range of at or about 6.8 kW to either at or about 16 kW or at or about 20 kW or above. Or, photovoltaic element 155 can provide output in the range of at or about 16 kW to at or about 20 kW or above. Furthermore, in various embodiments, all of the electrical outlets 150, combined, may output the aforementioned minimum output power. Incidentally, though parking spaces A through I are shown based on shelter 200, the shelter 200 can be of any suitable dimension, and, therefore, any suitable number of parking spaces greater than one and preferably greater than two may be provided.

In various embodiments, a photovoltaic element 155 of thin film type for supplying nine automobiles simultaneously may have an output associated with the 6.8 kW output mentioned above. For example, 6.8 kW may be the maximum output capacity for such a setup. Alternatively, a photovoltaic element 155 of solar panel type for supplying nine automobiles may have an output from at or about 16 kW to at or about 20 kW or above.

As mentioned above, photovoltaic element 155 can be electrically connected to interface 110. More specifically, photovoltaic element 155 can be electrically connected to inverter element 114 of power module 110. As will be discussed later, inverter element 114 inverts the direct current electricity from the photovoltaic element 155 to alternating current electricity.

Electrical outlets or receptacles 150 are mechanically connected to shelter 200 and electrically connected to interface 110. The electrical outlets 150 can be mechanically coupled to shelter 200 at any suitable place. In various embodiments, electrical outlets 150 can be coupled in an overhead fashion, so as to hang from the frame or the roof of shelter 200. Alternatively, electrical outlets 150 may be mechanically coupled to vertically oriented support beams. Furthermore, electrical outlets 150 can be arranged in any suitable configuration. For example, each parking space A through I under shelter 200 can have its own electrical outlet 150. In various embodiments, placement of electrical outlets 150 may be substantially central, in either the length-wise and/or widthwise planar overhead direction of the shelter 200, with respect to a defined parking space, which can facilitate use of the cord and plug irrespective of which side of an automobile an electrical port for charging the automobile is located.

Electrical outlets or receptacles 150 can be of any suitable configuration and can provide an electrical characteristic (e.g., power, voltage, current, and/or charge) to a load coupled thereto, such an electric car. For example, in various embodiments, electrical outlets 150 are retractable reels each having an extendable and retractable power cord and plug. The plug can be a male or a female plug, and the cord can have a stop to prevent it from retracting fully, so the cord and plug hang at a desired level when not in use. Thus, when fully retracted, power cord and plug can hang below the shelter 200 so as to be retrieved by a user or service provider of system 100. Furthermore, in various embodiments, the power cord and plug can extend a maximum distance from the reel (i.e., fully extended) so that they do not reach the ground or floor under the shelter 200, thereby preventing the cord and plug from contacting the ground and possibly becoming damaged by ground conditions (e.g., standing water) and/or being hit or run over by a vehicle entering under the shelter 200. In various embodiments, electrical outlets 150 may be rotatable or may swivel around an axis, or may be likewise movable. Such "movability" may be advantageous in order to position a plug or cord of the electrical outlet, for example.

Optionally, in various embodiments, each electrical outlet 150 can be comprised of two or more outlets or receptacles, such as two or more retractable reels each having an extendable and retractable power cord and plug. FIG. 1, for example, shows each electrical outlet 150 having two outlets $150_x(1)$ and (2). In this particular configuration, one outlet of the two can be for supplying a level 1 signal and the other can be for supplying a level 2 signal. In various embodiments, the level 1 signal may be a voltage from at or about 110 through at or about 120 VDC and the level 2 signal may be a voltage from at or about 220 through at or about 240 VDC. Alternatively, or optionally, a level 3 signal may be provided at or about 480 VDC, by a capacitor, for example, for a relatively short period of time. Electrical connectors, such as plugs and wiring for the electrical outlets 150 may be sized appropriately depending upon the output capacity of the electrical outlet (e.g., according to industry standards for signal levels 1 through 3, which may be defined as DC Level 1 and DC Level 2 (i.e., DC fast-charging) charge levels according to J1772 revised Oct. 15, 2012). Output capacity can mean at least the signal magnitude (e.g., voltage level) and/or an amount of time for supplying the signal at a particular magnitude. One reason to provide the capability of providing multiple signal or output levels is ensure use with different vehicle types that may be able to use only a specific signal level, a preferred signal level (e.g., for faster charging), or if one of the electrical outlets becomes damaged or otherwise inoperable—a backup or redundant aspect if you will. Of course if only one electrical outlet 150 is employed per parking space, each electrical outlet may be able to handle multiple signal levels and/or amounts of time for supplying a signal at a particular level.

Interface 110 can be electrically coupled to shelter 200 and one or more of charge holding element 130, load 140, and utility grid 300. Charge holding element 130 can be any suitable charge holding element, such as a battery, an array of batteries, a capacitor, or combination thereof. For example, in various embodiments, charge holding element 130 is a capacitor that can provide 480V for a relatively short period of time, for example, for instance fifteen minutes, to fully charge an electric vehicle connected to system 100. In various embodiments, interface 110 can be electrically coupled to shelter 200 via optional controllers 120.

Interface 110 can include a service panel 112, an inverter element 114, and an optional meter 116 if system 100 is connected to utility grid 300, or if such a meter is desirable to measure an amount of power received or provided, for example.

Generally speaking, interface 110 can manage or control power coming into system 100, leaving system 100, and/or to and from various electrical components of system 100. In various embodiments, interface 110 can receive an electrical signal or signals (e.g., power, voltage, current, etc.) from photovoltaic element 155, invert the signal or signals from direct current to alternating current, provide the alternating current signal or signals to another electrical system and/or convert the alternating current signal or signals back to a direct current signal or signals and provide these signals to electrical outlets 150. Alternatively, in various embodiments, power can be supplied from photovoltaic element 155 to electrical outlets 150 through interface 110 without being converted to an alternating signal (i.e., DC to DC). Interface 110 can output signals at the levels as described above, or any suitable levels for that matter, to the electrical outlets 150, or another load or loads.

Controllers 120 can be electrically coupled between interface 110 and corresponding electrical outlets 150. FIG. 1, for example, shows each controller 120 being electrically connected to three electrical outlets 150. Thus, each controller 120 may be configured to control power to electrical outlets associated with three parking spaces. Alternatively and not explicitly shown, one controller 120 may be coupled to all electrical outlets 150. In various embodiments, controllers 120 can be electrically coupled to service panel 112 of interface 110.

Controllers 120 can be operative to receive an input to selectively output signals to corresponding electrical outlets 150. For example, each controller 120 may receive an input to supply power to a particular one or particular ones of corresponding electrical outlets 150. For example, the input can be a user input and can include a touch or other physical selection by the user and/or a personalized electronic device, such as a magnetic card, an RFID device, a biometric device, or the like. As another example, each controller 120 may receive an input to select between which electrical outlets to use in the case of an electrical outlet 150 comprised of more than one electrical outlet, such as two outlets $150_X(1)$ and (2) shown in FIG. 1. Optionally, the input can be to choose an amount of charge (e.g., power, voltage, current, and/or time). For example, a user may select either or both of a voltage at which to charge and time for charging. Level 1, for example, may provide for charging times of ⅔ hour, 1 hour, or 2 hours. Level 2, for example, may provide for charging times of 15 minutes, ½ hour, or 1 hour. In various embodiments, times and voltage levels may be linked. As with above, the input can be a user input and can include a touch by the user and/or personalized electronic device, such as a magnetic card, an RFID device, a biometric device, or the like. In various embodiments, information regarding supply of any or all of the aforementioned may be recorded, for example, on a computer readable medium, such as a memory device. Additionally, such information may be supplied via a communication network to a database, a display screen, and/or some other computerized apparatus for analyzing and/or reporting the information.

Figure 2:
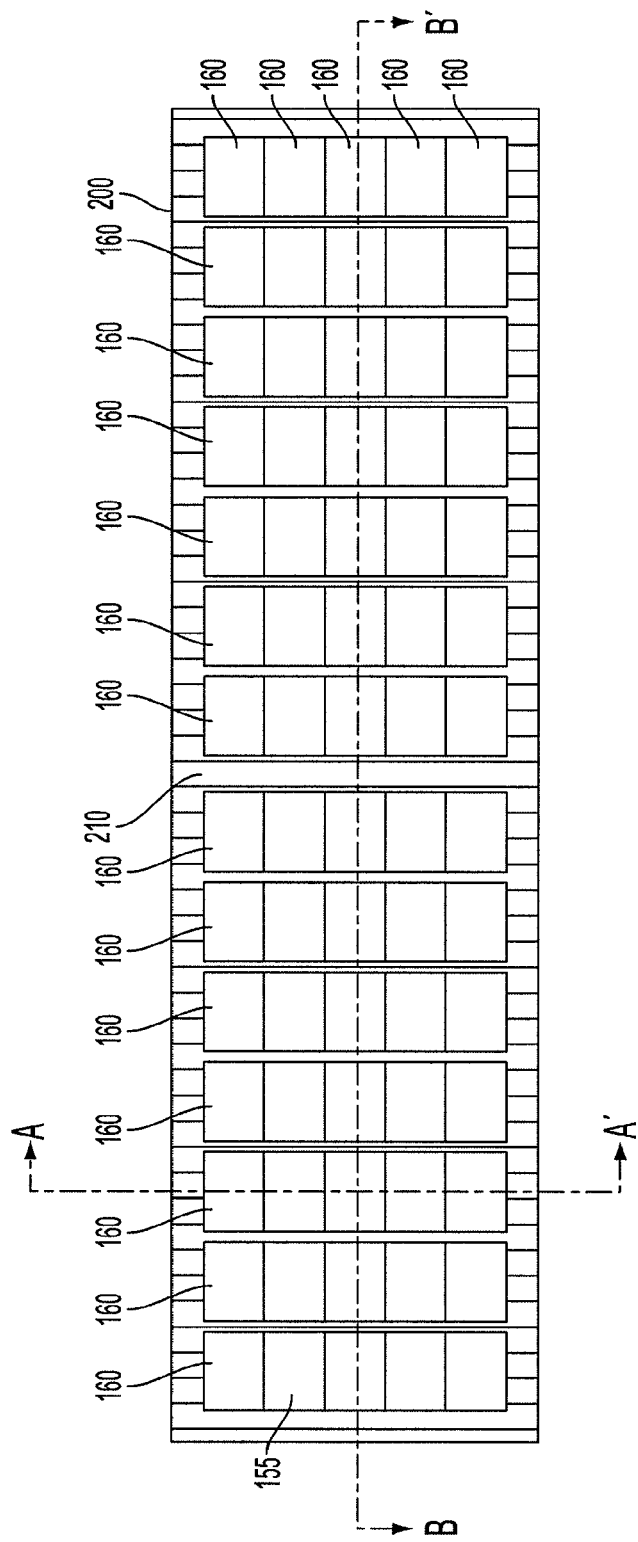
FIG. 2 is an overhead view of a shelter according to various embodiments of the disclosed subject matter.
Figure 3:
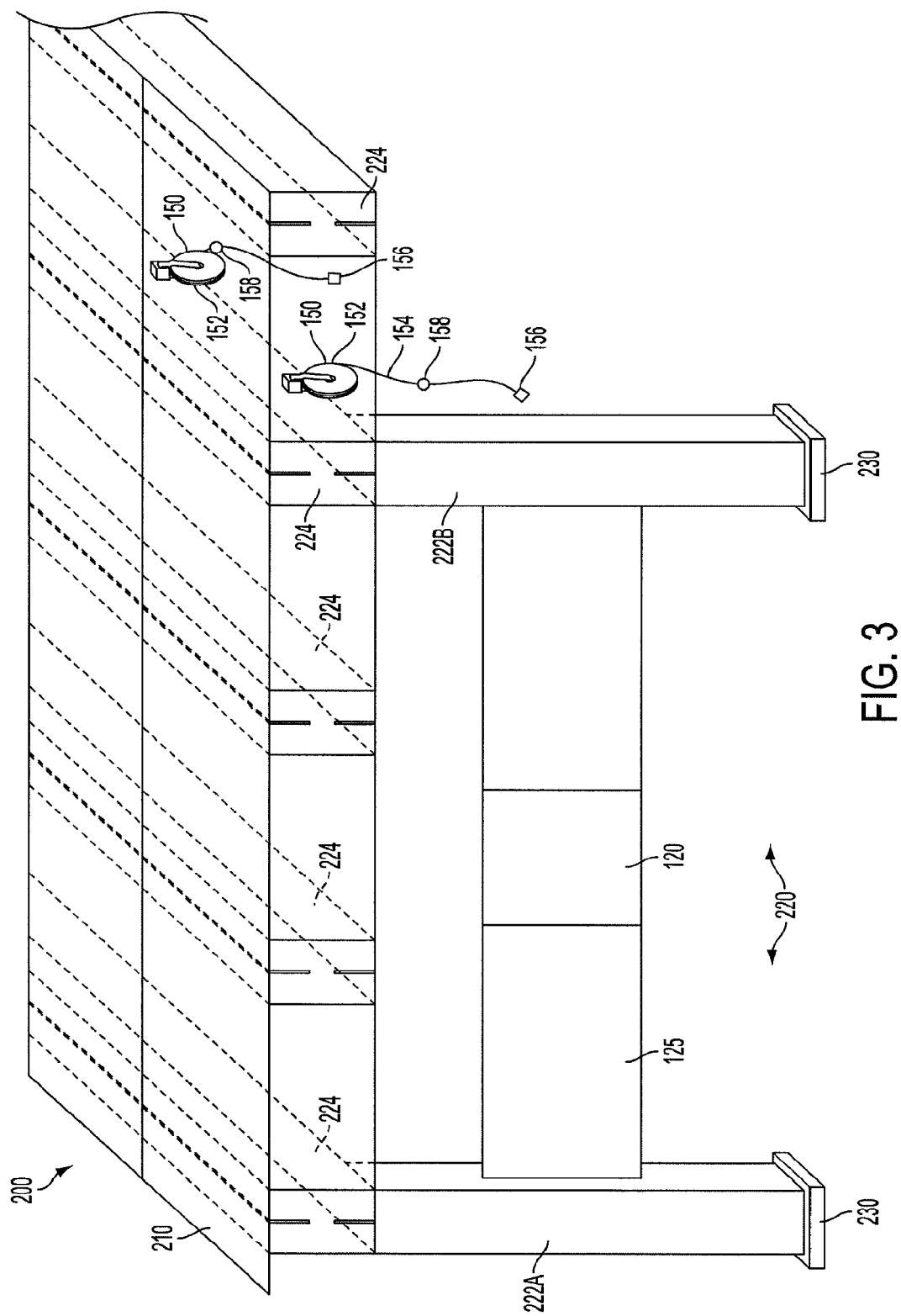
FIG. 3 is a cross section view of the shelter of FIG. 2 along line A-A'.
Figure 4:
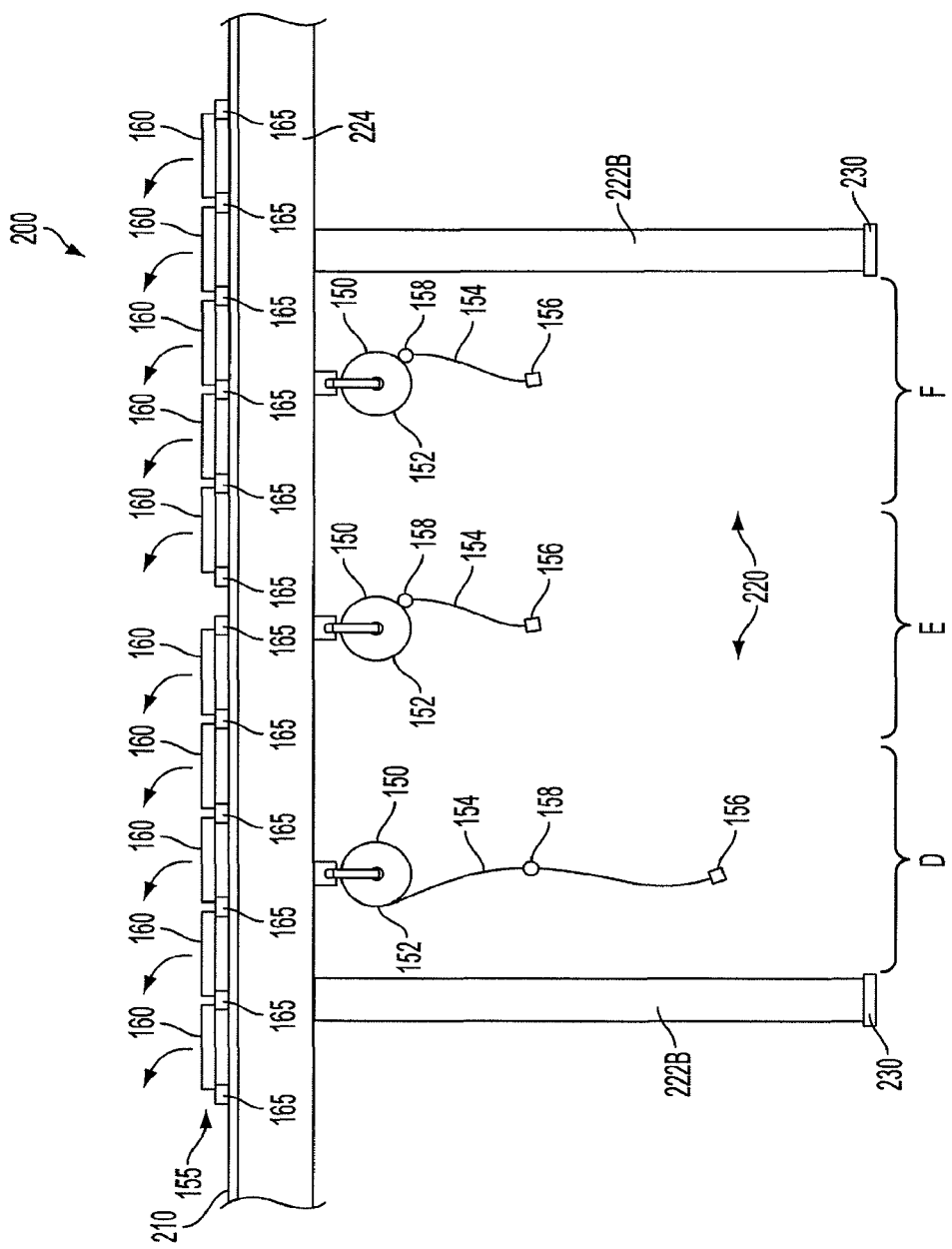
FIG. 4 is a cross section partial view of the shelter of FIG. 2 along line B-B'.
Figure 5:
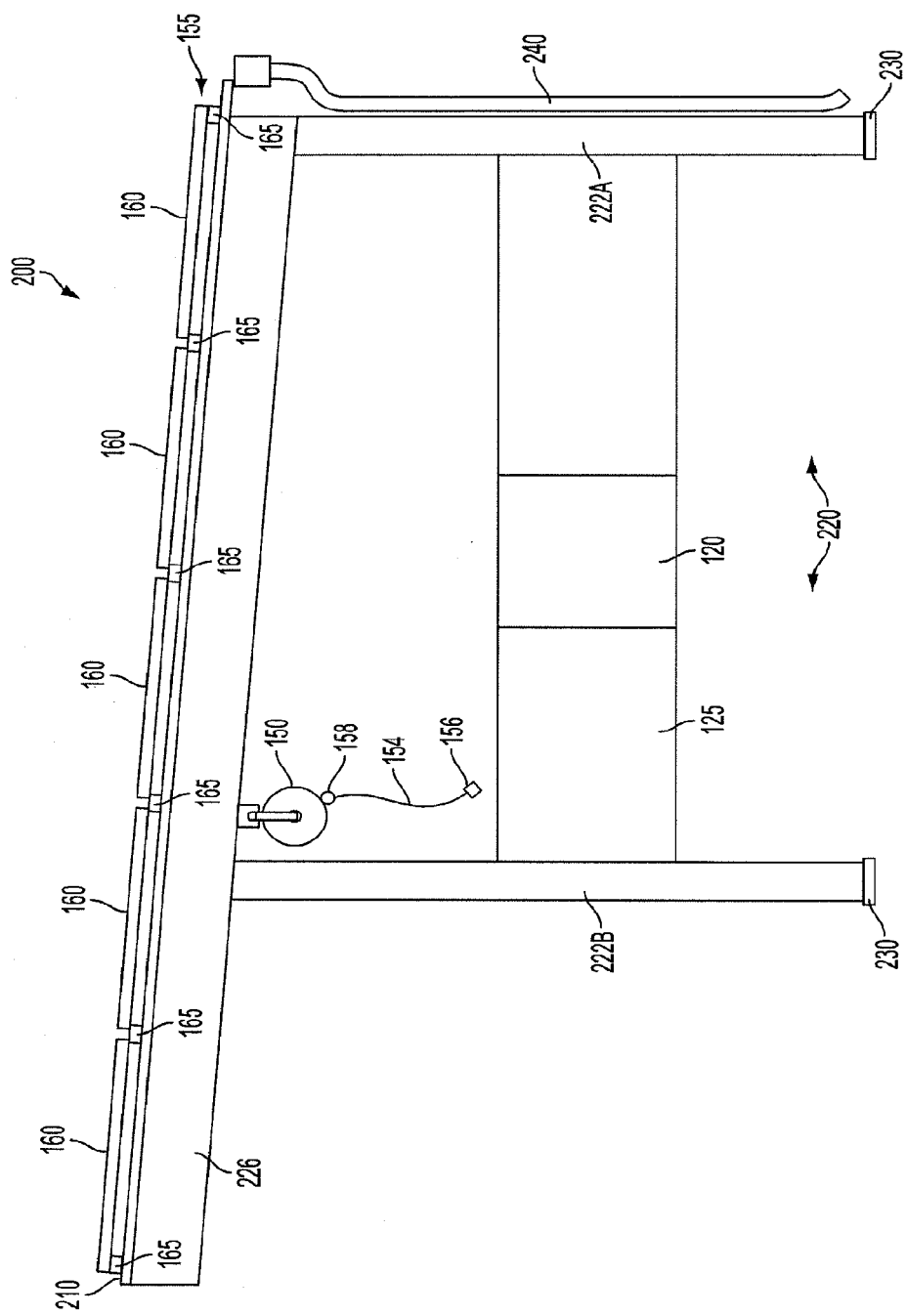
FIG. 5 is a side view of the shelter of FIG. 2.

FIGS. 2-5 show various views of a shelter 200 of charging system 100 according to various embodiments of the disclosed subject matter. FIG. 2 is an overhead view of shelter 200 according to various embodiments of the disclosed subject matter, wherein photovoltaic element 155 of FIG. 1 is comprised of an array of solar panels 160 arranged in rows and columns on the top of the roof 210 of shelter 200. FIG. 3 is a cross section view of the shelter 200 of FIG. 2 along line A-A'. FIG. 4 is a cross section partial view of the shelter 200 of FIG. 2 along line B-B'. FIG. 5 is a side view of the shelter 200 of FIG. 2.

Shelter 200 can have a roof 210 in the form of a metal standing seam roof having a length and a width in plan view. Generally speaking, a standing seam roof is constructed of many interlocking panels. The interlocking seam where two panels join together is raised above the roofs flat surface, allowing water to run off without seeping between panels. Standing seam roofs generally have advantages of withstanding rain, wind, snow conditions, as well as thermal-related reactions due to expansion and contraction. For example, such standing seam roofs may be constructed so as to qualify for a UL 580 wind uplift rating and/or to pass the ASTM E-1592 wind uplift test.

Roof 210 can have a length and a width in plan view. In various embodiments, the length can be greater than the width, such as shown in FIG. 2, for example. In various embodiments, the plan view length and the plan view width of the roof 210 are long and wide enough, respectively, to cover completely nine standard size automobiles arranged side-by-side (e.g., in parking spots A through I in FIG. 1) beneath the roof 210. In various embodiments, the plan view length and width to cover completely in plan view nine standard size automobiles arranged side-by-side is 81' by 20'. The dimensions of roof 210 are not limited to the aforementioned, and the length, for example, may be extended or decreased. For instance, the length may be increased or decreased in nine foot increments based on a standard nine foot parking space.

Furthermore, in various embodiments, the roof 210 can be a two-inch thick metal standing seam roof. Note, however, that the roof 210 can be of any suitable thickness. The metal can be any suitable metal, such as steel (including galvanized steel), aluminum, copper, or alloy thereof. Accordingly, the roof 210 and thus structure 200 according to various embodiments is a shelter in the sense that it provides both shade from solar exposure and protection from other weather-related elements, such as rain and snow. In particular, note that the shelter 200 is capable of withstanding loads from above (i.e., on its roof 210) of up to 60 lbs/ft². As will be discussed more below in regard to the frame of structure 200, roof 210 may be at a non-horizontal angle based on the frame configuration, such as the respective heights of vertically oriented support members. One advantage of having an "angled" roof 210 can be to assist with precipitation runoff, including directing such runoff to a particular runoff area, such as a ditch or drainage system. In various embodiments, structure 200 may have a water removal system, such as a gutter and drain system 240. Of course the roof 210 is not limited to the configuration and arrangement shown in FIGS. 2-5 and can be of any suitable configuration. For example, the roof may be generally in the shape of an upside-down 'V'.

Roof 210 can have a photovoltaic element 155 substantially as described above affixed to or mounted on a top side thereof. FIGS. 2, 4, and 5 show photovoltaic element 155 being comprised of an array of solar panels 160 arranged in rows and columns. Each solar panel 160 can be mechanically coupled to roof 210 by a coupling element 165. Coupling element 165 can be any suitable coupling element. In various embodiments, coupling element 165 can be comprised of an attachment clip, such as an S-5 attachment clip, that is connected to an end of the associated solar panel 160 and a raised portion of the roof 210 so as to raise the solar panel 160 above roof 210 by an amount, such as two inches.

Optionally, in various embodiments, coupling element 165 may allow its associated solar panel 160 to rotate upwardly about an axis of rotation. See, for example, the upwardly and counterclockwise rotating arrows shown in FIG. 4. As noted earlier, such repositioning capability in the form of rotating or otherwise can be provided so that each solar panel can be optimally oriented to capture a maximum amount of solar radiation possible and therefore output a maximum amount of direct current electricity. In various embodiments, a racking system may be used to reposition each of the solar panels 160. A racking system may be used to position the solar panels at predetermined angles. Furthermore, some or all of the solar panels may be repositioned at one or individually.

Shelter 200 also can have a metal frame 220 mechanically coupled to roof 210 and a foundation 230 mechanically coupled to the metal frame 220. Foundation can be of any suitable material, such as concrete or reinforced concrete. Moreover, foundation 230 can be formed as one piece or a plurality of portions. FIGS. 3-5, for example, show foundation being comprised of a plurality of portions 230.

In various embodiments, frame 220 can be constructed as shown in FIGS. 3-5 and can include vertically oriented support members or beams 222 and a plurality of horizontally oriented support members or beams 224. In various embodiments, first ends of each vertically oriented support member can be mechanically coupled to respective portions of the foundation 230. Incidentally, item 226 in FIG. 5 is an outer support member.

Vertical support members 222 can be of any suitable configuration, such as tubular support beams. In various embodiments, vertical support members 222 can be square-shaped or O-shaped tubular beams. Furthermore, in various embodiments, a first set of the vertically oriented support members 222A is of a first height and a second set of the vertically oriented support members 222B is of a second height, wherein the first height may be different from the second height. Such different heights can orient roof 210 at a non-horizontal angle, such as shown in FIG. 5, for example.

First and second heights can be any suitable heights. For example, in various embodiments, the first and second heights of the vertically oriented support members can be all greater than thirteen feet, six inches. Optionally or alternatively, a minimum overhead clearance under the entire shelter 200 may be thirteen feet, six inches. This particular height and/or overhead clearance can facilitate access and use of structure 200 and thus system 100 by "freight-type" vehicles, which presently cannot, by law, have a height greater than thirteen feet six inches. Alternatively, in various embodiments, first and second heights of the vertically oriented support members can be the same height.

Horizontally oriented support members 224 can be of any suitable arrangement. In various embodiments, the horizontally oriented support members 224 can run in a length-wise direction of the roof 210. Furthermore, more than one horizontally oriented support member 224 can be arranged in the length-wise direction for each particular length-wise axis associated therewith.

In addition, horizontally oriented support members 224 can be of any suitable configuration. For example, in various embodiments, horizontally oriented support members 224 can be tubular or generally tube-shaped elongate support members. FIG. 3 shows each horizontally oriented support member 224 being comprised of two 'C-shaped' purlins arranged in touching, face-to-face manner such that no or substantially no gap exists between touch points. Such an arrangement can be viewed as generally tube-shaped. Alternatively, horizontally oriented support members 224 can be square-shaped, hollow purlins. In yet another alternative embodiment, horizontally oriented support members 224 can be comprised of a combination of face-to-face arranged 'C-shaped' purlins and square-shaped hollow purlins, where at least one horizontally oriented support member is comprised of face-to-face arranged 'C-shaped' purlins and at least one other horizontally oriented support member is comprised square-shaped hollow purlins.

The horizontally oriented support members 224 can be flush mounted with an underside of roof 210. Put another way, top portions of the horizontally oriented support members 224 can be in direct contact with the bottom or underside of the roof 210. In various embodiments, no gap or spacing or substantially no gap or spacing may exist between the top portions of the horizontally oriented support members 224 that are in direct contact with the underside of roof 210. As indicated previously, such flush mounting of tubular or generally tube-shaped elongate support members can be advantageous because there is no gap or space for unwanted materials or objects to enter and occupy.

As can be seen from FIGS. 3-5, shelter 200 can be constructed without any sidewalls. That is to say, in various embodiments, metal frame 220 of shelter 200 may not have any sidewalls coupled thereto. Alternatively, metal frame 220 may not have any exterior sidewalls, but may have a girt 125 or the like at each column line (i.e., at each column of vertically oriented support members). In various embodiments, each girt 125 may have mounted thereto a controller 120 as described above. Technically the girt 125 is not a sidewall per se, but may have opposing ends respectively coupled to corresponding vertically oriented support members 222A, 222B, for example. Alternatively, girt 125 may be viewed as an internal sidewall.

Shelter 200 also includes a plurality of electrical outlets or receptacles 150 as noted above. Electrical outlets 150 can be of any suitable configuration. In various embodiments, electrical outlets 150 may be retractable, for example reels 152 having respective cords 154 and plugs 156 hanging from the reel 152, each of the cords 154 and plugs 156, when not in use, hanging above an associated space under the shelter 200 where a vehicle is to be parked. FIG. 4, for example, shows reels 152, cords 154, and plugs 156 hanging over parking spots D through F from FIG. 1, for example. In various embodiments, placement of electrical outlets 150 may be central with respect to a defined (e.g., imaginarily defined) or intended parking space, which can facilitate use of the associated cord 154 and plug 156 no matter where an electrical port of a vehicle for charging is located. Furthermore, each reel 152 may be spaced apart from at least one other adjacent reel 152 by a distance D.

The plug 156 can be a male or a female plug, and the cord 154 can have a stop 158 to prevent it from retracting fully, so the cord 154 and plug 156 can hang at a desired level when not in use. Accordingly, when fully retracted, cord 154 and plug 156 can hang below the shelter 200 so as to be retrieved by a user or service provider of system 100. Furthermore, in various embodiments, the cord 154 and plug 156 can extend a maximum distance from the reel (i.e., fully extended) so that they do not reach the ground or floor under the shelter 200, thereby preventing the cord 154 and plug 156 from contacting the ground and possibly becoming damaged by ground conditions (e.g., standing water) and/or being hit or run over by a vehicle entering under the shelter 200. In FIG. 4, the cord 154 and plug 156 associated with space D is shown in a fully extended position, and the cords 154 and plugs 156 associated with spaces E and F are shown in the fully retracted position.

Electrical outlets 150 can be coupled to any suitable position of shelter 200. FIGS. 3-5, for example, show electrical outlets 150 being mechanically coupled to a bottom portion of a horizontally oriented support member 224 or a first set of the horizontally oriented support members 224. In various embodiments, all of the horizontally oriented support members 224 of the set can be arranged along the same or substantially the same longitudinal axis, wherein the longitudinal axis may be in the same direction as the length-wise direction of the roof 210. Alternatively, in various embodiments, the electrical outlets 150 can be coupled to an underside portion of roof 210. In any case, electrical outlets can be submerged with respect to the roof 210.

Figure 6:
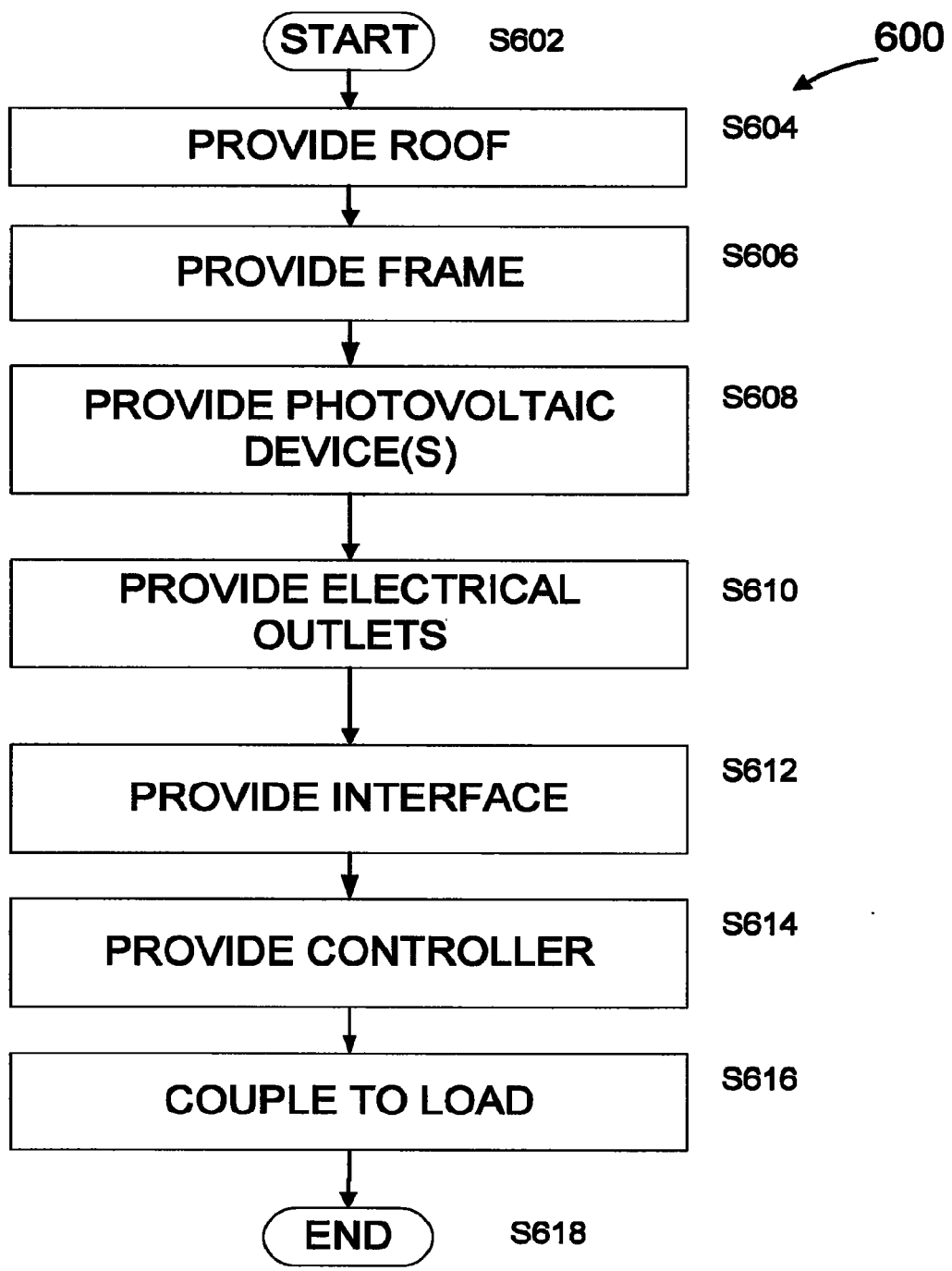
FIG. 6 is a flow chart of a method according to various embodiments of the disclosed subject matter.

FIG. 6 is a flow chart of a method 600 for making a shelter or canopy according to various embodiments of the disclosed subject matter.

Method 600 can begin at S602 and proceed to S604, for example, whereby a metal standing roof as described above can be provided. The method also can include S606, where a metal frame as described above can be provided. The method can further include S608 whereby a photovoltaic device or photovoltaic devices as described above can be provided on the top of the roof. Method 600 can additionally include S610, in which a plurality of electrical outlets or receptacles as described above can be provided. Method 600 also can include S612 of providing an interface electrically coupled to the photovoltaic device(s) and the electrical outlets as described above. Optionally, in various embodiments, method 600 can include S614 of providing one or more controllers as described above. In various embodiments, method 600 can additionally include S616 of electrically coupling at least one of the electrical outlets to a load, such as a battery of a vehicle, and providing power through the outlet to provide power to the load, for example to charge the battery. The method 600 can end at S618. Though not explicitly shown in FIG. 6, method 600 also can include operating the aforementioned provided components as described herein. Additionally, though method 600 is shown in FIG. 6 as being arranged in a particular order, the various steps provided therein may be in any suitable arrangement or order.

While the invention(s) has/have been described in conjunction with a number of embodiments, it is evident that many alternatives, modifications and variations would be or are apparent to those of ordinary skill in the applicable arts. Accordingly, Applicant intends to embrace all such alternatives, modifications, equivalents, and variations that are within the spirit and scope of the invention(s) described herein.

What is claimed is:

1. A solar powered charging shelter, comprising:
   a metal standing seam roof having a length and a width in plan view, the length being greater than the width;
   a metal frame, the metal frame including:
     a plurality of vertically oriented tubular metal support beams, a first set of said vertically oriented support beams being of a first height and a second set of said vertically oriented support beams being of a second height, the first height being different from the second height; and
     a plurality of horizontally oriented metal support beams running in a length-wise direction of said roof,
     wherein each said horizontally oriented metal support beam is comprised of two 'C-shaped' purlins arranged in touching, face-to-face fashion such that substantially no gap exists between touch points thereof; and
     wherein top portions of each said horizontally oriented metal support beam are flush mounted so as to be in direct contact with the bottom of said roof and such that substantially no gap exists between the top portions and the bottom of said roof;
   a plurality of solar panels mechanically coupled to the top of said roof, each said solar panel being mechanically coupled to said roof by a coupling element;
   a plurality of control stations, each said control station being operative to provide at least two charge levels for charging a vehicle, said at least two charge levels including a DC level 2 charge; and
   a plurality of extendable and retractable electrical outlets, each said electrical outlet being adapted to be mechanically releasably coupled to the vehicle to provide to the vehicle a vehicle user-selected one of any of said at least two charge levels,
   wherein said roof is at a non-horizontal angle based on the respective first and second heights of the first and second sets of said vertically oriented metal support beams, and
   wherein said charging shelter is without exterior sidewalls.

2. The solar powered charging shelter of claim 1, wherein each of said extendable and retractable electrical outlets is mechanically coupled to bottom portions of a group of said horizontally oriented metal support beams, all of the horizontally oriented metal support beams of the group being arranged along the same or substantially the same longitudinal axis, the longitudinal axis being in the same direction as the length-wise direction of the said roof and said electrical outlets being mechanically coupled in spaced apart relation to one another, and
   wherein said plurality of retractable electrical outlets are retractable reels having respective cords and plugs hanging from the reel.

3. The solar powered charging shelter of claim 1, wherein at least two of the charging stations are operative to simultaneously charge corresponding vehicles.

4. The solar powered charging shelter of claim 1, wherein each of said plurality of control stations is coupled to a corresponding vertical support beam of said plurality.

5. The solar powered charging shelter of claim 1, wherein said charging shelter is electrically coupled to a utility grid and is further configured to provide power to the utility grid and receive power from the utility grid.

6. The solar powered charging shelter of claim 1, wherein each said control station is adapted to receive a user input to select a charging time to charge the vehicle.

7. The solar powered charging shelter of claim 1, wherein each of said extendable and retractable electrical outlets is mechanically coupled to a corresponding one of said vertically oriented support beams.

8. The solar powered charging shelter of claim 1, wherein information regarding the user-selected charge level is displayed on a display screen.

9. The solar powered charging shelter of claim 1, wherein said charging shelter is without any sidewalls.

10. The solar powered charging shelter of claim 1, wherein the DC level 2 charge is supplied from a capacitive element.

11. The solar powered charging shelter of claim 1, wherein the at least one charge level is selectable via a vehicle user's physical input to the corresponding control station.

12. A charging system for a shelter having a metal roof and a metal frame mounted to the roof, the charging system comprising:
   an array of photovoltaic devices mounted on a top side of said roof;
   a plurality of extendable and retractable reel-type electrical outlets in correspondence with respective vehicle parking spaces under the shelter, each said reel-type electrical outlet being constructed and operative to output at least one voltage level for charging an electric vehicle when said electric vehicle is connected thereto; and
   a charging station to output the at least one voltage level, the at least one voltage level including a DC level 2 voltage level, to each of said extendable and retractable reel-type electrical outlets,
   wherein said shelter is without any exterior sidewalls.

13. The system of claim 12, wherein each of said at least one voltage level being selectable via an user input to the charging station, information regarding user-selected voltage level being displayable on a display screen of the charging station.

14. The system of claim 12, wherein said charging station is accessible by a personalized electronic device, the personalized electronic device being any one of a magnetic card, an RFID device, and a biometric device.

15. The system of claim 12, wherein each of said extendable and retractable reel-type electrical outlets is coupled to the shelter in overhead hanging fashion.

16. The system of claim 12, wherein said metal frame does not have any sidewalls connected thereto.

17. A method of making a charging canopy, comprising:
   providing a metal frame, the metal frame including:
     a plurality of vertically oriented support members, a first set of said vertically oriented support members being of a first height and a second set of said vertically oriented support members being of a second height, and
     a plurality of horizontally oriented support members,
   providing a photovoltaic device as an upper-most portion of said charging canopy;
   providing a plurality of extendable and retractable electrical outlets, said electrical outlets being in spaced apart relation to one another and being configured to output separately a plurality of different electrical characteristics of the same type to a load coupled thereto, one of the electrical characteristics being a DC level two charging characteristic, the DC level two charging characteristic including a component thereof at or at about 480 volts; and
   providing a user interface unit electrically coupled to said photovoltaic device and said electrical outlets, said user interface unit being configured to receive power from said photovoltaic device and to provide to each of said electrical outlets, separately, each of the plurality of different electrical characteristics of the same type.

18. The method of claim 17, further comprising a metal standing seam roof mechanically coupled to the metal frame,
   wherein said plurality of retractable electrical outlets are coupled to one of bottom portions of each said horizontally oriented support member or the bottom of said roof; and
   wherein said plurality of retractable electrical outlets are retractable reels having respective cords and plugs hanging from the reel, each of the cords and plugs, when not in use, hanging above an intended parking space under the canopy where a vehicle is to be parked.

19. The method of claim 17, further comprising coupling one of said electrical outlets to a vehicle to charge a battery of the vehicle.

20. The method of claim 17, wherein said metal frame does not have any sidewalls connected thereto.

21. The method of claim 18, wherein said roof is at a non-horizontal angle based on the respective first and second heights of the first and second sets of said vertically oriented metal support beams.

\* \* \* \* \*